United States Patent
Ikeda et al.

(10) Patent No.: US 9,777,375 B2
(45) Date of Patent: Oct. 3, 2017

(54) CONVERGING MIRROR FURNACE

(71) Applicant: NATIONAL INSTITUTE OF ADVANCED INDUSTRIAL SCIENCE AND TECHNOLOGY, Chiyoda-ku, Tokyo (JP)

(72) Inventors: Shinichi Ikeda, Tsukuba (JP); Shiro Hara, Tsukuba (JP); Takanori Mikahara, Tsukuba (JP); Hitoshi Habuka, Tsukuba (JP); Sommawan Khumpuang, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 368 days.

(21) Appl. No.: 14/362,348

(22) PCT Filed: Nov. 30, 2012

(86) PCT No.: PCT/JP2012/081093
§ 371 (c)(1),
(2) Date: Jun. 2, 2014

(87) PCT Pub. No.: WO2013/081107
PCT Pub. Date: Jun. 6, 2013

(65) Prior Publication Data
US 2014/0338591 A1    Nov. 20, 2014

(30) Foreign Application Priority Data

Dec. 2, 2011    (JP) .................................. 2011-264939

(51) Int. Cl.
*C30B 13/16*     (2006.01)
*C23C 16/48*     (2006.01)
(Continued)

(52) U.S. Cl.
CPC ............ *C23C 16/482* (2013.01); *C30B 13/24* (2013.01); *F27B 17/0025* (2013.01);
(Continued)

(58) Field of Classification Search
CPC .......... C30B 13/16; C30B 13/22; C30B 13/28
See application file for complete search history.

(56) References Cited

U.S. PATENT DOCUMENTS 6,033,470 A  *  3/2000  Fujii ....................... C30B 13/00
                                                       117/41
2002/0112659 A1*  8/2002  Sekijima ................. C30B 13/00
                                                       117/50
(Continued)

FOREIGN PATENT DOCUMENTS

CN    101611177 A    12/2009
JP    S62-292265 A   12/1987
(Continued)

OTHER PUBLICATIONS

Notification of Transmittal of Translation of the International Preliminary Report on Patentability (PCT/IB/338) mailed Jun. 12, 2014, with International Preliminary Report on Patentability (PCT/IB/373) and Written Opinion of the International Searching Authority (PCT/ISA/237), for corresponding international application PCT/JP2012/081093.
(Continued)

*Primary Examiner* — Robert M Kunemund
(74) *Attorney, Agent, or Firm* — Law Office of Katsuhiro Arai

(57) ABSTRACT

Provide a converging mirror-based furnace for heating a target by way of reflecting from a reflecting mirror unit the light emitted from a light source and then irradiating a target with the reflected light, wherein said target-heating converging-light furnace is such that: the reflecting mirror unit comprises a primary reflecting mirror and secondary reflecting mirror; the light emitted from the light source is reflected
(Continued)

sequentially by the primary reflecting mirror and secondary reflecting mirror and then irradiated onto the target; and the light reflected by the secondary reflecting mirror and irradiated onto the target surface is not perpendicular to the target surface. Based on the above, a system that uses converged infrared light to provide heating can be made smaller while keeping its heating performance intact, even when the system uses a revolving ellipsoid.

25 Claims, 7 Drawing Sheets

(51) Int. Cl.
 F27B 17/00 (2006.01)
 H01L 21/67 (2006.01)
 C30B 13/24 (2006.01)
 F27D 99/00 (2010.01)
(52) U.S. Cl.
 CPC ............ *H01L 21/67115* (2013.01); *F27D 2099/0026* (2013.01); *Y10T 117/108* (2015.01)

(56) References Cited

U.S. PATENT DOCUMENTS

| | | |
|---|---|---|
| 2007/0131162 A1 | 6/2007 | Nishimura et al. |
| 2010/0037817 A1 | 2/2010 | Shindo |

FOREIGN PATENT DOCUMENTS

| | | |
|---|---|---|
| JP | S63-000986 A | 1/1988 |
| JP | H05-205852 A | 8/1993 |
| JP | H11255593 A | 9/1999 |
| JP | 2000-223488 A | 8/2000 |
| JP | 2001-165878 A | 6/2001 |
| JP | 2005-195685 A | 7/2005 |
| JP | 3668738 B1 | 7/2005 |
| JP | 2007-145611 A | 6/2007 |
| JP | 2008-107050 A | 5/2008 |
| KR | 1020100004937 A | 1/2010 |
| WO | 2005/075713 A1 | 8/2005 |

OTHER PUBLICATIONS

An Office Action issued by Korean Intellectual Property Office, mailed Dec. 15, 2015, for Korean counterpart application No. 10-2014-7015047.
International Search Report (ISR), mailed Jan. 8, 2013, issued for International Application No. PCT/JP2012/081093.
An Office Action issued by the State Intellectual Property Office of China, mailed Apr. 29, 2015, with a search report (Apr. 21, 2015) for Chinese counterpart application No. 201280059406.6.

\* cited by examiner

[Fig. 1 (a)]
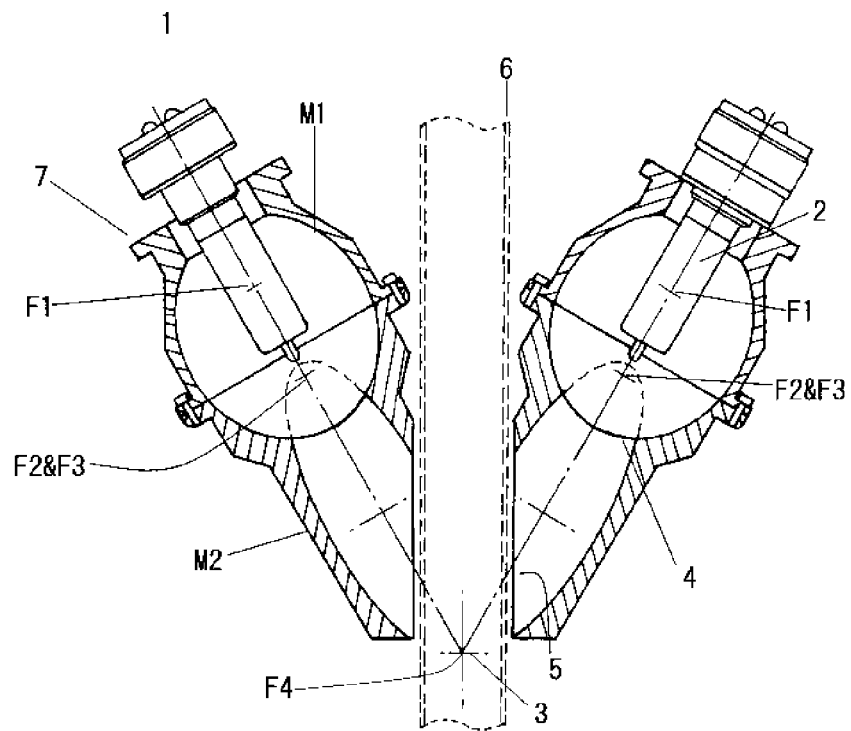
[Fig. 1 (b)]
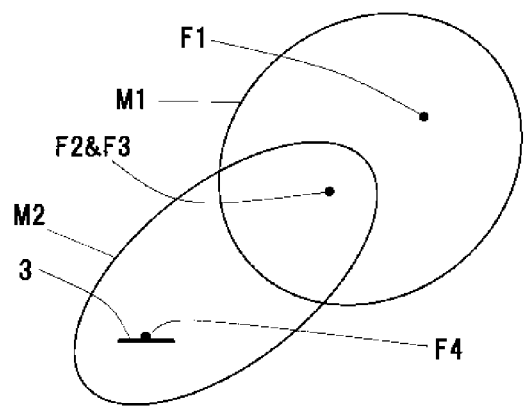

[Fig. 2]
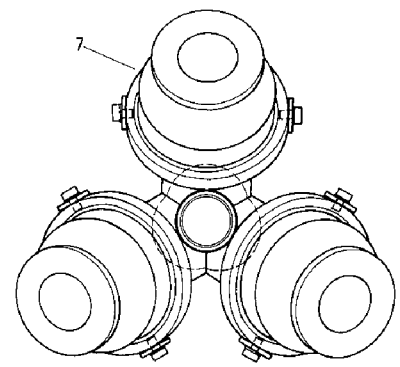
[Fig. 3]
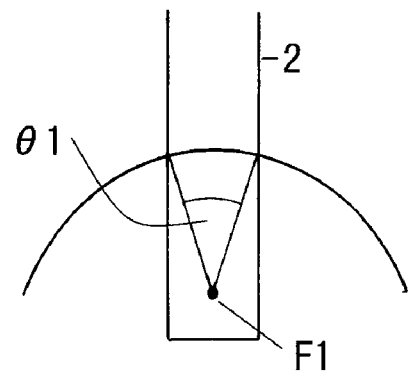
[Fig. 4]
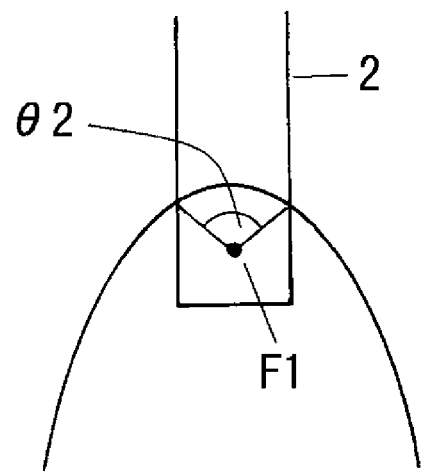

[Fig. 5]
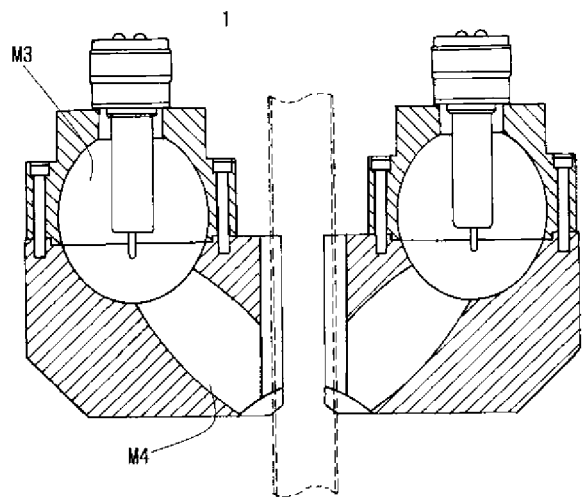
[Fig. 6 (a)]
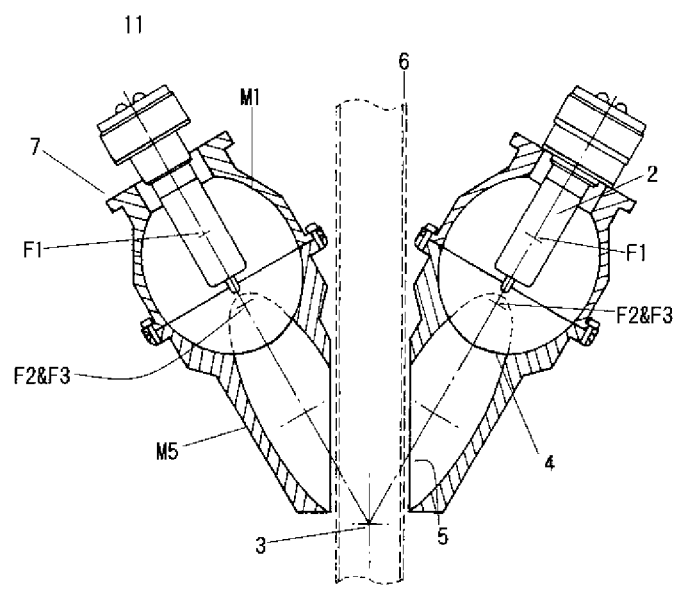

[Fig. 6 (b)]
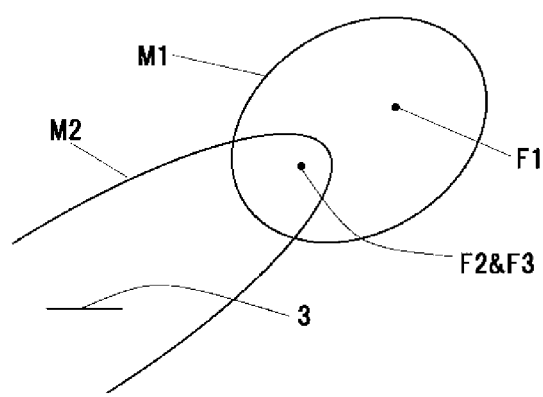
[Fig. 7]
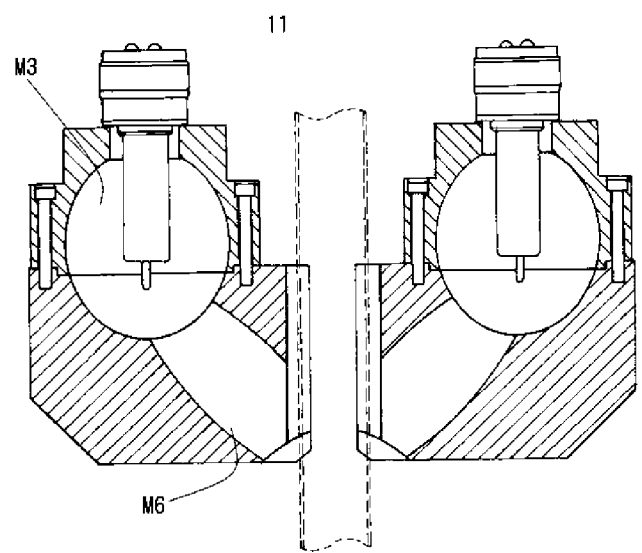

[Fig. 8]
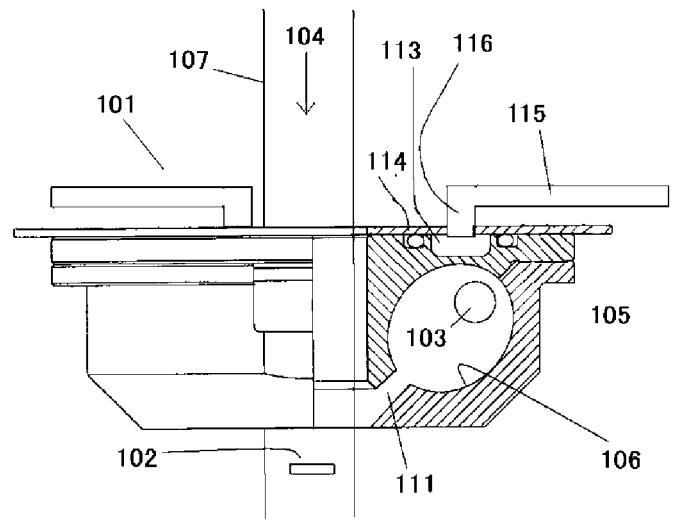
[Fig. 9]
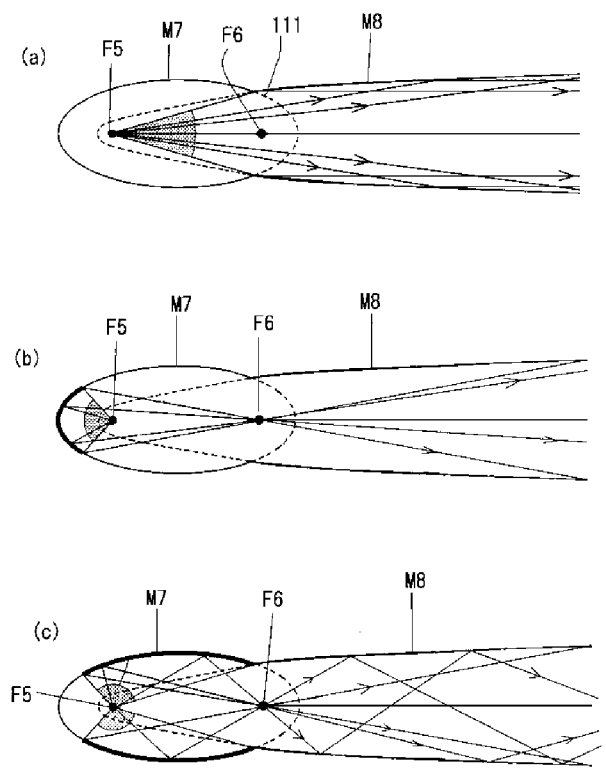

[Fig. 10]
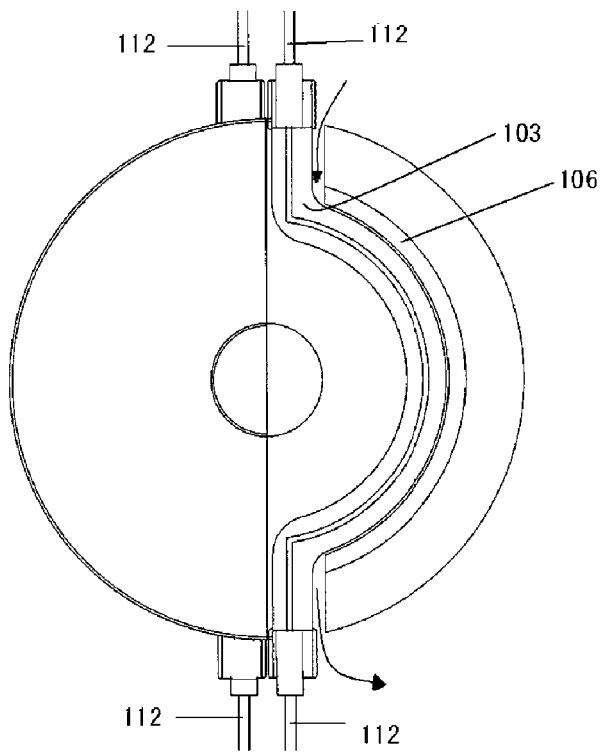
[Fig. 11]
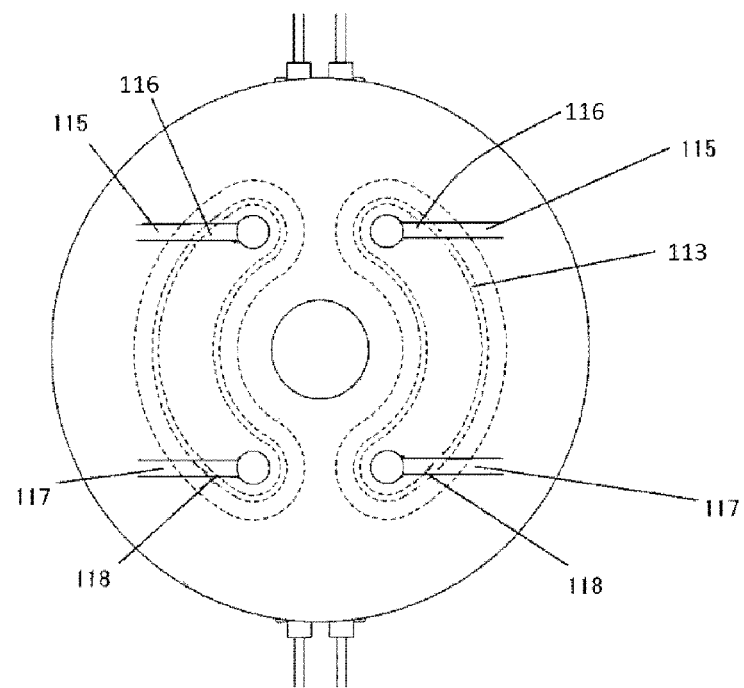

[Fig. 12]
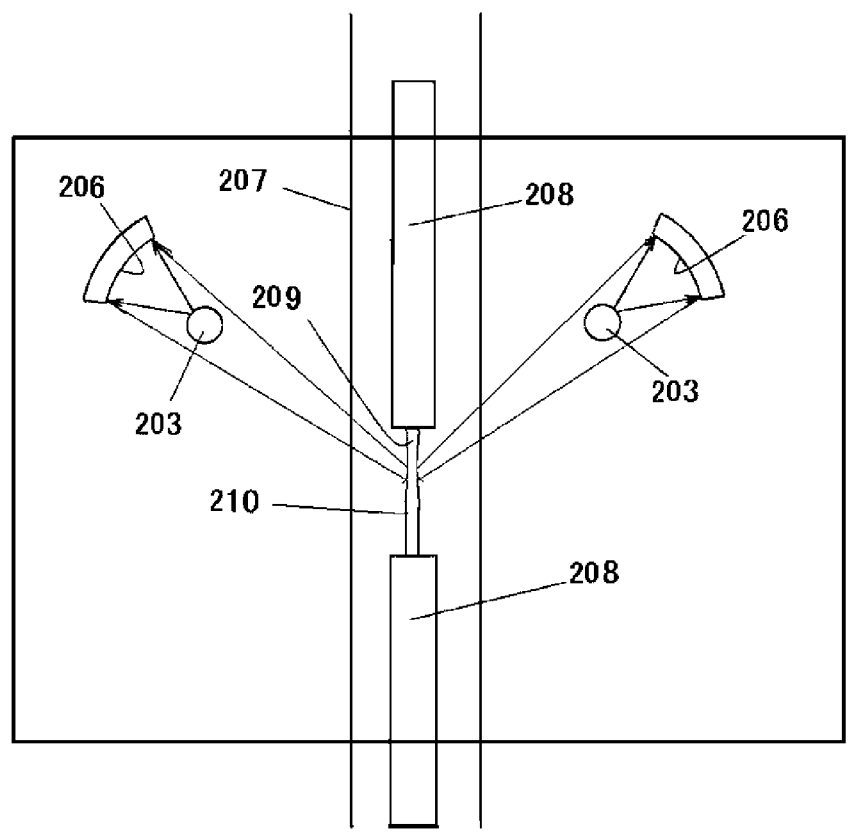

CONVERGING MIRROR FURNACE

This application is the U.S. National Phase under 35 U.S.C. §371 of International Application PCT/JP2012/081093, filed Nov. 30, 2012, which claims priority to Japanese Patent Application No. 2011-264939, filed Dec. 2, 2011. The International Application was published under PCT Article 21(2) in a language other than English.

TECHNICAL FIELD

The present invention relates to a converging mirror furnace, which is a furnace used for processing or otherwise treating materials by means of heating them with infrared light.

BACKGROUND ART

As described in Patent literatures 1 to 3, converging mirror furnaces are known as systems used for manufacturing single crystal that converge infrared light onto, and thereby heat, the target aluminum oxide or other sintered compact body and seed crystal.

These converging mirror furnaces each comprise: a vertically moving stage on which aluminum oxide or other sintered body and seed crystal are set; a reflecting mirror constituted by a revolving ellipsoid and positioned in a manner surrounding the seed crystal in the horizontal direction; and a halogen lamp or other light source installed at one focal point of the revolving ellipsoid, with the sintered body and seed crystal positioned at the other focal point of the revolving ellipsoid.

Then, infrared light emitted from the light source is converged directly or via the reflecting surface of the reflecting mirror in such a way that it focuses onto, and thereby heats, the sintered body and seed crystal, and when this furnace is heating, the stage is lowered to grow single crystal.

Also, as described in Patent Literature 4, an art is known whereby a target base is placed at one focal point of a reflecting surface whose interior surface constitutes a revolving ellipsoid, and then infrared light is emitted from a surface light source being a heater installed in the reflecting surface, in order to heat the target on the target base with the infrared light directly or by causing it to reflect upon the ellipsoid.

Furthermore, as described in Patent Literature 5, a resistance furnace is known, which is a furnace used for semiconductor manufacturing in order to heat through the quartz board a silicon wafer placed on a quartz board. Even though infrared light is used as the heat source, however, the interior size of the furnace must be large enough to be able to heat the wafer or other object of a larger size by taking into account the quartz board inserted into the furnace and therefore it takes a long time for the temperature to rise enough to accomplish resistance heating, which makes it impracticable to achieve a single heating process that can be operated over a short period of time.

Additionally, a heat treatment system is also known, which comprises a surface constituted by multiple infrared lamps installed in a manner facing the surface of the placed wafer and positioned vertically above the wafer, and this surface is provided in parallel with the wafer surface, so that when this system is used to heat the wafer surface, infrared light is irradiated over an area large enough to cover the diameter of the wafer.

BACKGROUND ART LITERATURE

Patent Literature

[Patent Literature 1] Japanese Patent Laid-open No. 2007-145611
[Patent Literature 2] Japanese Patent No. 3668738
[Patent Literature 3] WO2005/075713
[Patent Literature 4] Japanese Patent Laid-open No. 2008-107050
[Patent Literature 5] Japanese Patent Laid-open No. 2000-223488

SUMMARY OF THE INVENTION

Problems to be Solved by the Invention

Conventional Converging Mirror-based Furnaces are such that an infrared light source is provided at one focal point of a concave surface constituted by an ellipsoidal mirror, and infrared light from the light source is reflected by the concave surface or irradiated directly to heat the target set at the other focal point from above or side.

Also note that, as is evident from the inventions described in Patent Literatures 1 to 3, a structure comprising a light source provided at one focal point of a cut revolving ellipsoid with a target set at the other focal point would result in a circle formed from one focal point drawn around the target used as a common focal point.

With this structure, a target of flat shape is heated primarily from 360° horizontal directions, which means that, if such target is set horizontally, infrared light is irradiated primarily onto the peripheral surfaces of the target, but less calorific heat is absorbed by its flat surfaces. Additionally, even if the target is set vertically or at an angle, both sides of the target are heated primarily and it is not possible to heat a specific side at high efficiency.

As a result, systems other than the target are heated to high temperatures and therefore an air or water-based cooling unit of larger scale is needed to cool these systems, which consequently necessitates larger equipment to supply energy, air, or water required for cooling. Particularly when air is introduced to cool the heating source, it is difficult to achieve efficient cooling because introducing air into a space of relatively large volume surrounding the revolving ellipsoid achieves limited cooling as only parts of the air contact the heating source directly.

Also, with a structure whereby the target is set in a place sandwiched by revolving ellipsoid mirrors, considerably large revolving ellipsoid mirrors must be used relative to the size of the target, in addition to the aforementioned large equipment required for cooling, which limits how much the size of the system can be reduced.

The placed wafer, etc., can be heated relatively uniformly using a heating system comprising multiple infrared lamps installed in a manner facing the surface of the wafer and positioned vertically above the wafer; however, a gas supply means that should be provided above the wafer to treat it by supplying gas onto the wafer surface during heating cannot be provided in a manner facing the wafer surface without inhibiting the irradiation of infrared light. Additionally, the installation surface of infrared lamps must be larger than the target in order to heat the target uniformly. This means that the majority of energy emitted from certain infrared lamps, especially those installed at the peripheral edges of the heating system, irradiates not only the target, but also heats other members around the target. Furthermore, the target is heated not only by means of emission from the infrared lamps, but also to a non-negligible degree by means of conduction from the heated surrounding members, which consequently makes it difficult to control the heating temperature of the target. What is more, the interior space of the furnace must be increased to control the heating temperature of the target more accurately, which makes the whole furnace larger than it is wanted as a result.

Furthermore, providing infrared lamps or other heating systems above the target in a manner facing the target makes it difficult to install anything else to monitor the heating condition, to supply gas, or to manipulate the operation.

Means for Solving the Problems (First Converging Mirror-Based Furnace)
1. A converging mirror-based furnace for heating a target by causing light emitted from a light source to be reflected by a reflecting mirror unit to irradiate the target, wherein the light irradiated onto the target surface is not perpendicular to the target surface.
2. A converging mirror-based furnace for heating a target by causing light emitted from a light source to be reflected by a reflecting mirror unit to irradiate the target,
wherein the reflecting mirror unit comprises a primary reflecting mirror and secondary reflecting mirror and the light emitted from the light source is reflected sequentially by the primary reflecting mirror and secondary reflecting mirror to irradiate the target, where the light reflected by the secondary reflecting mirror irradiated onto the target surface is not perpendicular to the target surface.
(Second Converging Mirror-Based Furnace)
3. A converging mirror-based furnace for heating a target by causing light emitted from a light source to be reflected by a reflecting mirror unit to irradiate the target,
wherein at least one reflecting mirror unit with a light source installed inside is provided;
the reflecting mirror unit is formed by combining two spheroid mirrors each having a reflecting surface constituted by the interior surface of a spheroid, where one of the spheroid mirrors is referred to as a primary reflecting mirror and the other, a secondary reflecting mirror;
the light source is installed in the primary reflecting mirror wherein the light source is positioned at one focal point of the primary reflecting mirror, while an opening provided in the primary reflecting mirror is inter-connected with an opening provided in the secondary reflecting mirror in such a way that another focal point of the primary reflecting mirror is positioned at one focal point of the secondary reflecting mirror, and the reflecting mirror unit is provided in such a way that another focal point of the secondary reflecting mirror is positioned at a center point of the surface-to-be-heated of the target placed in the furnace, with the opening provided at a side of the other focal point in the secondary reflecting mirror so that the light passes through the opening toward the surface-to-be-heated to irradiate the surface-to-be-heated; and
the long axis of an ellipse configuring the secondary reflecting mirror is not perpendicular to the surface-to-be-heated.
4. A converging mirror-based furnace for heating a target by causing light emitted from a light source to be reflected by a reflecting mirror unit to irradiate the target,
wherein at least one reflecting mirror unit with a light source installed inside is provided;
the reflecting mirror unit is formed by combining two spheroid mirrors each having a reflecting surface constituted by the interior surface of a spheroid, where one of the spheroid mirrors is referred to as a primary reflecting mirror and the other, a secondary reflecting mirror;
a light source is installed in the primary reflecting mirror in such a way that the light source is positioned at one focal point of the primary reflecting mirror, while an opening provided in the primary reflecting mirror is inter-connected with an opening provided in the secondary reflecting mirror in such a way that another focal point of the primary reflecting mirror is positioned at one focal point of the secondary reflecting mirror, and the reflecting mirror unit is provided in such a way that another focal point of the secondary reflecting mirror is positioned at a place different from a center point of the surface-to-be-heated of the target placed in the furnace, with the opening provided at a side of another focal point in the secondary reflecting mirror so that the light passes through the opening toward the surface-to-be-heated to irradiate the surface-to-be-heated; and
the long axis of an ellipse configuring the secondary reflecting mirror is not perpendicular to the surface-to-be-heated.
5. A converging mirror-based furnace for heating a target by causing light emitted from a light source to be reflected by a reflecting mirror unit to irradiate the target,
wherein at least one reflecting mirror unit with a light source installed inside is provided;
the reflecting mirror unit is formed by combining two spheroid mirrors each having a reflecting surface constituted by the interior surface of a spheroid, where one of the spheroid mirrors is referred to as a primary reflecting mirror and the other, a secondary reflecting mirror;
a light source is installed in the primary reflecting mirror in such a way that the light source is positioned at one focal point of the primary reflecting mirror, while an opening provided in the primary reflecting mirror is inter-connected with an opening provided in the secondary reflecting mirror in such a way that another focal point of the primary reflecting mirror is positioned at one focal point of the secondary reflecting mirror, and the reflecting mirror unit is provided in such a way that another focal point of the secondary reflecting mirror is positioned on the normal line which passes through a center point of the surface-to-be-heated of the target placed in the furnace, with the opening provided at a side of the other focal point in the secondary reflecting mirror so that the light passes through the opening toward the surface-to-be-heated to irradiate the surface-to-be-heated; and
the long axis of an ellipsoid body constituting the secondary reflecting mirror is positioned diagonally to the normal line of the surface-to-be-heated.
6. A converging mirror-based furnace according to any one of 3 through 5, wherein the ratio of the major axis to the minor axis of the ellipse constituting the primary reflecting mirror is equal to or less than the ratio of the major axis to the minor axis of the ellipse constituting the secondary reflecting mirror.
7. A converging mirror-based furnace according to any one of 3 through 6, wherein the primary reflecting mirror and secondary reflecting mirror are connected in such a way that the light source is positioned along a straight line connecting the two focal points on the ellipse of the secondary reflecting mirror.
8. A converging mirror-based furnace according to any one of 3 through 6, wherein the primary reflecting mirror and secondary reflecting mirror are connected in such a way that the two focal points on the ellipse of the primary reflecting mirror and two focal points on the ellipse of the secondary reflecting mirror are not present on the same straight line.

9. A converging mirror-based furnace according to any one of 3 through 8, wherein the angle formed by the surface of the target and the line connecting the two focal points on the ellipse of the secondary reflecting mirror is 20 to 70°.

(Third Converging Mirror-Based Furnace)

10. A converging mirror-based furnace for heating a target by causing light emitted from a light source to be reflected by a reflecting mirror unit to irradiate the target,
    wherein at least one reflecting mirror unit with a light source installed inside is provided;
        the reflecting mirror unit is formed by combining a primary reflecting mirror being a spheroid mirror whose reflecting surface is constituted by the interior surface of a spheroid, with a secondary reflecting mirror being a revolving paraboloidal mirror whose reflecting surface is constituted by the interior surface of a revolving paraboloidal mirror;
        the light source is installed in the primary reflecting mirror in such a way that the light source is positioned at one of two focal points on the primary reflecting mirror, while an opening provided in the primary reflecting mirror is inter-connected with an opening provided in the secondary reflecting mirror in such a way that the other focal point of the primary reflecting mirror is positioned at a focal point of the secondary reflecting mirror, and a converging mirror unit is provided in such a way that a rotational axis of the revolving paraboloidal mirror constituting the secondary reflecting mirror and a center point of the surface-to-be-heated of the target placed in the furnace are positioned along one straight line, with the opening in the secondary reflecting mirror facing the target so that the light is irradiated onto the surface-to-be-heated; and
        the rotational axis of the secondary reflecting mirror is not perpendicular to the surface of the target.

11. A converging mirror-based furnace according to 10, wherein the shortest distance between a focal point of the primary reflecting mirror and an elliptic surface thereof is greater than the shortest distance between a focal point of the secondary reflecting mirror and a parabolic surface thereof.

12. A converging mirror-based furnace according to 10 or 11, wherein the primary reflecting mirror and secondary reflecting mirror are connected in such a way that the two focal points on the primary reflecting mirror are positioned along a line extended from the rotational axis of the secondary reflecting mirror being a revolving paraboloidal mirror.

13. A converging mirror-based furnace according to 10 or 11, wherein the primary reflecting mirror and secondary reflecting mirror are connected in such a way that the two focal points on the primary reflecting mirror are not positioned along a line extended from the rotational axis of the secondary reflecting mirror being a revolving paraboloidal mirror.

14. A converging mirror-based furnace according to any one of 10 through 13, wherein the angle formed by the line normal to the surface-to-be-heated and the rotational axis of the secondary reflecting mirror is 20 to 70°.

(Fourth Converging Mirror-Based Furnace)

15. A converging mirror-based furnace for heating a target by causing light emitted from a light source to be reflected by a reflecting mirror unit to irradiate the target,
    wherein the reflecting mirror unit has a primary reflecting mirror whose reflecting surface is a part of the interior surface of a ring drawn by rotating around the normal line a closed curved line which is present on the same plane as the normal line passing through the center of the surface-to-be-heated and not intersecting with the normal line;
        a light source is installed in the ring that forms the primary reflecting mirror having a ring-shaped, in a manner being arranged over the ring either partially or entirely along the circumferential direction;
        the target is set on a plane perpendicular to the normal line but not intersecting with the ring, with a slit provided in the reflecting surface near the point of intersection between the shortest straight line connecting the center of the surface-to-be-heated and light source on one hand and the reflecting surface on the other, in order to irradiate the light onto the target; and
        the end of the primary reflecting surface where the slit is formed is connected to the reflecting surface that forms the secondary reflecting surface.

16. A converging mirror-based furnace according to 15, wherein the angle formed by the normal line and the line connecting the light source and the center of the target surface is 20 to 70°.

17. A converging mirror-based furnace according to 15 or 16, wherein a ring-shaped light source is installed in a circular pattern in the ring that forms the ring-shaped primary reflecting mirror, and a reflecting surface of the reflecting plate that converges the light from the ring-shaped light source onto the surface-to-be-heated is installed perpendicularly to the circle formed by the ring-shaped light source.

18. A converging mirror-based furnace according to any one of 1 through 17, wherein, during heating, the relative position of the reflecting mirror and the target is made variable.

19. A converging mirror-based furnace according to any one of 1 through 18, wherein, during heating, the condition of the target in terms of the temperature of the target, thickness of the formed film, etc., can be monitored at least from one direction such as directly above, diagonally above, or a side of the target.

20. A converging mirror-based furnace according to any one of 1 through 19, wherein, during heating, the target is made rotatable.

Effects of the Invention

The first converging mirror-based furnace proposed by the present invention is a converging mirror-based furnace that adopts a reflecting mirror unit comprising a primary reflecting mirror and secondary reflecting mirror and heats a target by causing the light emitted from a light source to be reflected sequentially by the primary reflecting mirror and secondary reflecting mirror to finally irradiate the target surface from a direction other than perpendicular thereto. In addition, this irradiating direction other than perpendicular thereto is not a direction parallel with the target surface.

According to the present invention, which is structurally different from a conventional system designed to heat a target from the side with infrared light reflected by a revolving ellipsoid and thereby has no heating system beside the target or along a line extended from the target surface, the condition of the target can be monitored from the side so that the operating status of the CVD furnace or single crystal growth system, whichever the case may be, can be known during heating.

In addition, heating a target with the infrared light irradiated from directions not perpendicular to the target surface allows placing the infrared lamps and the ring-shaped reflecting surface at positions not directly in front of the target surface, and the size of the reflecting mirror unit is reduced compared to when a conventional revolving ellipsoid is adopted, and consequently the clearance between the infrared lamps and ring-shaped reflecting surface and the target surface can be smaller.

If the system size is reduced as explained above, the output of the infrared lamps is decreased, and accordingly, the size of the reflecting mirrors also becomes smaller. However, the energy originally required to heat the target itself does not change; consequently, the density of energy received by the target does not decrease, and may even increase.

In the case of a CVD furnace, for example, gas can be introduced from the front of the CVD-treated target surface to allow quality thin film to be formed on the heated target by means of CVD.

The second converging mirror-based furnace has a reflecting mirror unit comprising two reflecting mirrors including a primary reflecting mirror and secondary reflecting mirror whose reflecting surfaces are the interior surfaces of a spheroid. The ratio of the major axis to the minor axis of the ellipse constituting the revolving ellipsoidal mirror of the primary reflecting mirror is equal to or less than the ratio of the major axis to the minor axis of the ellipse constituting the secondary reflecting mirror.

Particularly with the second converging mirror-based furnace, the other focal point of the secondary reflecting mirror may be positioned at the center point of the surface-to-be-heated of the target placed in the furnace, or at a location other than the center point of the surface-to-be-heated of the target placed in the furnace, such as along a normal line passing through the center point of the target surface.

With the second converging mirror-based furnace, it is possible to heat uniformly an area of the target surface that specifically requires heating and the light can be irradiated without focusing on the target surface, in which case it is possible to heat the target surface even more uniformly.

Also, by adjusting the ratio of the major axis to the minor axis of the ellipse constituting the primary reflecting mirror to equal to or less than the ratio of the major axis to the minor axis of the ellipse constituting the secondary reflecting mirror, the infrared lamp which is the light source can be placed at one focal point of the spheroid closer to a sphere, which in turn allows more of the light reflecting by the primary reflecting mirror to travel to the reflecting surface of the secondary reflecting mirror.

To be specific, because the ellipsoid of the primary reflecting mirror near its focal point is closer to a sphere of a longer radius than that of the secondary reflecting mirror, installing the light source lamp in the primary reflecting mirror allows more of the light emitted from the lamp to be reflected by the reflecting surface, compared to when the light source is installed directly at the focal point of the secondary reflecting mirror, and consequently the target can be irradiated with stronger light and heated efficiently.

In addition, by connecting the primary reflecting mirror and secondary reflecting mirror in such a way the light source is positioned on a straight line connecting the two focal points of the ellipse of the secondary reflecting mirror, more of the light components from the light source are irradiated directly onto the target without reflecting by either reflecting mirror, thus allowing the target surface to be heated more efficiently.

When the primary reflecting mirror and secondary reflecting mirror are connected in such a way that the two focal points of the ellipse of the primary reflecting mirror and the two focal points of the ellipse of the secondary reflecting mirror are not on the same straight line, the orientation of the primary reflecting mirror relative to the secondary reflecting mirror can be changed in a desired manner, which in turn allows the size of the reflecting mirror unit to be reduced, and the shape of the reflecting mirror unit to be changed in a desired manner according to the overall shape of the converging mirror-based furnace.

In addition, each type of converging mirror-based furnace may be structured and installed in such a way that the surface-to-be-heated of the target is horizontally set, but the surface-to-be-heated of the target surface may also be placed in a non-horizontal manner.

Note that the size of the opening at the joint between the primary reflecting mirror and secondary reflecting mirror may be large. The larger the opening, the greater the components of light that are not reflected on the primary reflecting mirror.

On the other hand, the smaller the opening, the greater the components of light emitted from the infrared lamp or other light source and then reflected sequentially by the primary reflecting mirror and secondary reflecting mirror to heat the target surface.

Additionally, the third condensing mirror-based furnace is the same as the second condensing mirror-based furnace except that its secondary reflecting mirror is constituted by a revolving paraboloidal mirror, which is different from the second converging mirror-based furnace.

Compared to the second converging mirror-based furnace, the third converging mirror-based furnace is characteristic in that the components of light reflected by the secondary reflecting mirror are parallel with one another and thus are not focused on the surface-to-be-heated of the target, and also because the light irradiated onto the target surface includes parallel light components, the surface of the target can be heated more uniformly.

With this third converging mirror-based furnace, the fact that the shortest distance between a focal point of the primary reflecting mirror and the ellipsoid thereof is greater than the shortest distance between the focal point of the secondary reflecting mirror and the parabolic surface thereof allows the infrared lamp which is the light source to be placed at one focal point of the spheroid closer to a sphere, which in turn allows more of the components of light reflected by the primary reflecting mirror to travel to the reflecting surface of the secondary reflecting mirror.

Also, as with the second converging mirror-based furnace, the primary reflecting mirror and secondary reflecting mirror can be connected in such a way that the light source is positioned along a line extended from the rotational axis of the revolving paraboloidal surface of the secondary reflecting mirror, so that more of components of light from the light source are irradiated directly onto the target without reflecting by either reflecting mirror, thus allowing the target surface to be heated more efficiently.

When the primary reflecting mirror and secondary reflecting mirror are connected in such a way that the two focal points of the ellipse of the primary reflecting mirror are not on the same straight line as the rotational axis of the secondary reflecting mirror, the orientation of the primary reflecting mirror relative to the secondary reflecting mirror can be changed in a desired manner, which in turn allows the size of the reflecting mirror unit to be reduced, or the shape of the reflecting mirror unit to be changed according to the overall shape of the converging mirror-based furnace.

The fourth converging mirror-based furnace has characteristics in terms of the structure of its reflecting mirror unit comprising a ring-shaped primary reflecting mirror and secondary reflecting mirror whose interior surface provides a reflecting surface, and the position relationship of the unit relative to the surface-to-be-heated of the target.

To be specific, said condensing mirror-based furnace is characterized in that:

the reflecting mirror unit has a primary reflecting mirror whose reflecting surface is a part of the interior surface of a ring drawn by rotating around the normal line a closed curved line which is present on the same plane as the normal line passing through the center of the surface-to-be-heated and not intersecting with the normal line;

a light source is installed in the ring that forms the ring-shaped primary reflecting mirror, in a manner covering the ring either partially or entirely in the circumferential direction;

the target can be set at a position outside the reflecting mirror and not on the plane that includes the ring, with a slit provided in the reflecting surface near the point of intersection between the shortest straight line connecting the center of the heated surface and light source on one hand and the reflecting surface on the other, in order to irradiate the light onto the target; and the end of the primary reflecting surface where the slit is formed is connected to the reflecting surface that forms the secondary reflecting surface.

In the fourth converging mirror-based furnace, light reflected by the ring-shaped primary reflecting mirror passes through the slit and is reflected by the secondary reflecting mirror, and then irradiated onto the target surface, consequently the light is irradiated from multiple directions onto the surface-to-be-heated of the target. By heating from multiple directions, the target surface can be heated uniformly, especially in cases where the surface-to-be-heated of the target is difficult to be heated uniformly with the light from a certain direction only.

Note that the reflecting surface of the secondary reflecting mirror can be a part of a surface formed by rotating an ellipse or parabola around the rotational axis and, in this case, the focal point of the ellipse or parabola can be positioned at the location of the light source.

If the closed curved line is an ellipse, the ellipse is tilted so that when the line connecting the two focal points of the ellipse is extended toward the target, it contacts the center of the target surface, and an opening is also provided in the ellipse around the point of intersection between the extended line and the ellipse. Furthermore, a slit that opens a part of parabola from the opening toward the target is provided by compositing parts of the parabola having, as the confocal point, one of the two focal points of the ellipse farther away from the target.

Then, the light source is provided at the focal point of the ellipse farther away from the target, and the other focal point is common with the focal point of the ellipse or parabola constituting the secondary reflecting mirror, so that the light emitted from the light source can be more efficiently reflected by the secondary reflecting mirror and also irradiated onto the target surface.

In FIG. 9, the confocal point may be the focal point of the ellipse closer to the target.

With this fourth converging mirror-based furnace, when the closed plane is an ellipse the resulting reflecting mirror may be one perpendicular to the normal line passing through the center of the target and formed by compositing an ellipsoidal body mirror and paraboloidal mirror whose reflecting surfaces are their interior surfaces rotating around a vertical axis outside the ellipse and parabola, respectively, and there may also be a condensing mirror that indicates the confocal point and is formed by installing a light source along the circle around the vertical axis.

For this light source, point light sources arranged in a circle, two semicircular light sources, or a circular light source, may be used.

The fourth converging mirror-based furnace proposed by the present invention and constituted as above is a converging mirror-based furnace whose interior surface is formed by compositing a ring-shaped body that constitutes the primary reflecting surface and has a section shape of an ellipse, etc., with a reflecting surface that constitutes the secondary reflecting surface, where the light emitted from the light source installed in this ring-shaped body is irradiated directly toward the target on the target base or reflected by the primary reflecting mirror and/or secondary reflecting mirror first.

With this fourth converging mirror-based furnace, the target surface can be heated from multiple directions, and it is thus possible to heat the target surface more uniformly.

These four types of furnaces from the first through fourth all have a heating light source diagonally above the target and the target surface is heated from diagonally above, so that space can be formed directly above or below, or beside, the target. Accordingly, a quartz pipe may be provided to supply treatment gas or temperature or other measurement means, or control means may be provided above the target. It is also possible to install a means for transporting the target in a space provided beside the target, for example, to allow for effective utilization of space around the target, which in turn allows for more efficient implementation of a series of operations from introducing the target into the system to removing it from the system.

Also according to these converging mirror-based furnaces, multiple light sources can be provided diagonally above the target so that the majority of energy emitted from the light sources is irradiated onto the target surface and that light can be emitted toward the target from all directions diagonally above it.

Here, the distance from one location on the target surface to the light source in a given direction is relatively long, but the distance to the light source in the opposite direction is relatively short, and the same trend applies to any location on the target surface. This means that, after all, the total energy of light irradiated from multiple directions is uniform at any location on the target surface and that any location on the target surface is heated uniformly.

Also according to the first through third converging mirror-based furnaces, where the light source used is not ring-shaped, use of, for example, three sets of converging mirror units means that each set is installed at a 120° interval and consequently light is irradiated onto the target surface from three directions diagonally above it, and in the view point that virtually uniform heating is possible, it is not different from actually irradiating light from 360° all directions.

As just described above, since the target surface can be virtually heated from 360° directions diagonally above it, more uniform heating is possible.

Also according to the fourth converging mirror-based furnace, heating from closer to 360° directions allows for heating from more directions than is possible with the first through third converging mirror-based furnaces. In this case, the fourth converging mirror-based furnace is better in that, even when the total calorific value received by the reflecting mirror as a whole is the same, the volume of the reflecting mirror itself is larger and therefore the heating temperature becomes lower and the cooling unit can be made simpler.

In other words, if the light is irradiated diagonally above the target from one direction, some areas of the target surface will be closer to the light source while other areas will be far from the light source. As a result, light with relatively high energy density is irradiated onto areas of the target close to the light source while light with relatively low energy density is irradiated onto areas of the target far from the light source, implying that areas of the target close to the light source are heated to high temperatures and faster, whereas the temperature increases relatively slowly in areas far from the light source, meaning that the target surface may be heated unevenly.

When focusing a light source on the surface-to-be-heated, the tendency of irregular heating becomes even more significant, whereas if the light source is not focused on the surface-to-be-heated, a blurred image of the light source is formed on the target surface and the target surface tends to be heated more uniformly. However, there may be some components of light not irradiated onto the surface-to-be-heated, resulting in that light emitted from a light source may not efficiently irradiate the surface of the target.

Given the uniform heating of the target by such mechanism, as well as the fact that the light source is normally illuminating due to heating of its filament and that a filament is not completely a point light source, strictly speaking the secondary reflecting mirror may or may not be focused on the target in the present invention.

If light is irradiated in a so-called defocused state where the mirror is not focused, the image of the filament is not focused on the target. As a result, uneven light irradiation does not occur where the shape of the filament is reflected by the target, and in this sense, too, the target surface can be heated more uniformly.

Needless to say, the image of the filament may be focused on the target if the revolving ellipsoid is focused on the target, but when light is irradiated onto the target from multiple directions, including in a defocused state, the images formed by the focused lights from different directions are overlapped and consequently light can be irradiated uniformly onto the target.

In this case, the target is irradiated with light in a defocused state and thus heated uniformly in the second and third converging mirror-based furnaces, as with the second converging mirror-based furnace in a defocused state as mentioned above.

According to the present invention, the target is heated uniformly and the light source is present diagonally above the target, and therefore space can be provided directly above, beside, and below the target, as well as diagonally to the target other than in the directions of the light source and reflecting mirror, and this space can be utilized to install a quartz pipe, introduce gas, place and operate processing/moving jigs, move the target, and detect, control, and otherwise manipulate the temperature, supply an amount of gas, and the like. It is also possible to heat the top surface of the target placed horizontally in the case of CVD, etc.

In addition, a conventional heating system using a revolving ellipsoid only heats the target from the side or completely from the perpendicular direction and thus its application is limited to a single crystal growth system, etc., but heating the target from diagonally above, as achieved by the present invention, makes it possible to heat the top surface of the target placed horizontally in the case of CVD, etc., in addition to supporting the aforementioned application.

Moreover, the diameter of the reflecting surface as a whole can be reduced compared to when a spheroid is installed not above the target, but horizontally in a manner surrounding the target 360° and used as the reflecting surface, as has been the case traditionally, and consequently the size of the system as a whole can be reduced.

Furthermore, the target such as a wafer may or may not be rotated. Also, deposits on the interior wall of the quartz pipe due to decomposition of gas can be reduced because even when gas (main gas or support gas) blows through the quartz pipe against the wafer, etc., nothing but the target is heated.

In addition, less energy is used and the amount of energy consumed by heating the reflecting surface, etc., is also smaller, which makes it possible to use a smaller cooling unit and reduce the size of the entire system. Particularly with the fourth converging mirror-based furnace, where the light source is installed in the relatively small space inside the ring-shaped reflecting surface, the light source can be cooled efficiently by introducing air into the ring-shaped reflecting surface to contact the light source.

Infrared lamps can be used as light sources and infrared light can be used as light; however, the light is not limited to infrared light. It can be any form of light capable of heating the target by irradiation. In addition, such light sources that emit the light are also not limited to infrared lamps.

BRIEF DESCRIPTION OF THE DRAWINGS

FIG. 1 (a) First and second converging mirror-based furnaces of the present invention FIG. 1 (b) Conceptual drawing of the first and second converging mirror-based furnaces of the present invention FIG. 2 Top view of the first or second converging mirror-based furnace using three reflecting mirror units FIG. 3 Drawing illustrating the relationship of the primary reflecting mirror and light source used for a converging mirror-based furnace conforming to the present invention FIG. 4 Drawing illustrating the relationship of the primary reflecting mirror and light source used for a converging mirror-based furnace of the present invention FIG. 5 First and second converging mirror-based furnaces of the present invention FIG. 6 (a) First and third converging mirror-based furnaces of the present invention FIG. 6 (b) Conceptual drawing of the first and third converging mirror-based furnaces of the present invention FIG. 7 First and third converging mirror-based furnaces of the present invention FIG. 8 First and fourth converging mirror-based furnaces of the present invention FIG. 9 Drawing of optical path in the fourth converging mirror-based furnace of the present invention FIG. 10 Top view of the fourth converging mirror-based furnace of the present invention FIG. 11 Top view of the fourth converging mirror-based furnace of the present invention FIG. 12 Schematic illustration of crystal growth system using the system of the present invention

DESCRIPTION OF THE SYMBOLS

1 Converging mirror-based furnace
2 Infrared lamp
3 Target
4 Connection part between the primary reflecting mirror and secondary reflecting mirror
5 Opening
6 Quartz pipe
7 Converging mirror system
M1 Primary reflecting mirror
M2 Secondary reflecting mirror
M3 Primary reflecting mirror
M4 Secondary reflecting mirror
M5 Secondary reflecting mirror
M6 Secondary reflecting mirror
M7 Ring-shaped reflecting surface
M8 Secondary reflecting mirror
F1 One focal point of the primary reflecting mirror
F2 Other focal point of the primary reflecting mirror
F3 One focal point of the secondary reflecting mirror
F4 Other focal point of the secondary reflecting mirror
F5 Focal point of the secondary reflecting mirror
F6 Focal point of the secondary reflecting mirror
101 Converging mirror-based furnace
102 Target
103 Infrared lamp
104 Gas
105 Housing
106 Ring-shaped reflecting surface
107 Pipe
θ1 and 2 Angles within which emitted infrared light contributes to heating in each mode
111 Slit
112 Power cable
113 Cooling jacket
114 Lid member
115 Cooling water supply pipe
116 Cooling water supply port
117 Cooling water drain pipe
118 Cooling water drain port
203 Infrared lamp
206 Ring-shaped reflecting surface
207 Quartz pipe
208 Fixing means
209 Material bar
210 Seed crystal bar

MODE FOR CARRYING OUT THE INVENTION

The present invention in the case where an infrared lamp is used as a light source and infrared light is used as light is explained below by referring to the drawings. The structure of the present invention can also be adopted when other types of light source and light are adopted.

Depending on the properties and materials of the target, it may be heated by light other than infrared light and thus the light used in the present invention in this case may include light other than infrared light.

(First Converging Mirror-Based Furnace)

The first converging mirror-based furnace is a converging mirror-based furnace equipped with a structure that encompasses the second through fourth converging mirror-based furnaces explained below.

As an example, the first converging mirror-based furnace is explained based on FIG. 1 (a).

A first converging mirror-based furnace proposed by the present invention is a furnace that heats the surface of a target 3 by irradiating it with the light emitted from a light source that has been reflected using a reflecting mirror unit.

The reflecting mirror unit is a unit comprising a primary reflecting mirror M1 and secondary reflecting mirror M2, where an infrared lamp 2 or other light source is provided in the primary reflecting mirror M1 and the light emitted from the light source is reflected by the interior surface of the primary reflecting mirror M1, after which the reflected light is guided into the secondary reflecting mirror M2 and reflected by the reflecting surface on the interior surface of the secondary reflecting mirror M2 to be released through an opening 5 and irradiated onto the surface of the target 3.

Since no part of the secondary reflecting mirror M2 is positioned directly in front of the surface of the target 3, none of the light emitted through the opening 5 in the secondary reflecting mirror M2 is irradiated perpendicularly onto the surface of the target 3.

The following points apply commonly to the following second to fourth converging mirror units.

The converging mirror-based furnaces of the present invention can be used generally for systems for treatment involving heating, such as CVD systems and crystal growth systems. In particular, they can be used for applications where heating is achieved by light.

It is also a furnace that heats the target 3 by irradiating the target 3 with the light reflected by the reflecting surface of the secondary reflecting mirror. Concurrently with this heating or before or after the heating, the target may be supplied with gas 104 from above or processed using a jig (not illustrated), or a window may be provided on its side so that the condition of the target 3 can be monitored while the target 3 is heated under desired conditions.

If this system is used as a crystal growth system, a quartz pipe 207 is inserted between the converging mirror units and a polycrystal material bar 209 and seed crystal bar 210 are fixed to top and bottom fixing means 208, respectively, and driven inside the pipe, as shown in Schematic Drawing 12. Then, in the same manner as with the system shown in FIG. 1 (a), infrared light irradiated from the infrared lamp 203 reflects on the primary reflecting mirror and secondary reflecting mirror and the polycrystal material bar 209 and seed crystal bar 210 move downward while being heated, to produce single crystal.

The converging mirror-based furnace used in the present invention is a system that uses a light source that emits light and heats a target by the irradiated light.

an infrared lamp generally is used for the light source, but it is not limited to the foregoing. Any light source that can be used for a furnace which uses light for heating can be used.

The reflecting mirror unit of the present invention is comprised by the primary reflecting mirror and secondary reflecting mirror and the light source is installed in such a way that filaments, etc. are positioned inside the primary reflecting mirror. The primary reflecting mirror and secondary reflecting mirror are connected via openings provided in each reflecting mirror allowing light to pass through it. For this reason, the majority of the components of light emitted from the light source is reflected, first by the primary reflecting mirror and then by the secondary reflecting mirror, to be emitted outside the reflecting mirror unit and irradiated onto the target surface.

In other words, the primary reflecting mirror is the primary reflecting mirror that reflects the light emitted from the light source and the secondary reflecting mirror is the secondary reflecting mirror that reflects the light reflected by the primary reflecting mirror.

Of course, some of the light emitted from the light source may not be reflected by the primary reflecting mirror but is reflected by the secondary reflecting mirror directly, and then irradiated onto the target surface.

Moreover, depending on the structure of the reflecting mirror unit, some of the light emitted from the light source may be reflected neither by the primary reflecting mirror nor by the secondary reflecting mirror, but instead irradiated onto the target surface directly.

The reflecting mirrors can be composed of publicly known materials and it is allowed to adopt any structures having publicly known reflectivity, including pure metallic base materials or metallic-base materials with another metal layer acting as a reflecting surface on the internal surface.

In addition, the primary and secondary reflecting mirrors, and the reflecting mirror unit constituted by them, may be manufactured by any relevant manufacturing method such as machining from blocks made of metal, etc., but they may also be manufactured by dividing each component into multiple blocks and manufacturing each block individually, and then assembling these blocks.

Moreover, in the present invention, it is essential that light is not irradiated onto the target surface from the perpendicular direction to the target surface. Here, light not irradiated onto the target surface from the perpendicular direction to the target surface in this case means that light is irradiated onto the target surface from an oblique direction, in other words, at a finite angle.

If light is irradiated onto the target surface from the perpendicular direction to the target surface, the secondary reflecting mirror, or at least some part of it, has to be positioned at a location directly in front of the target surface in a manner facing it. When treating the target surface by supplying gas during heating as in the case of CVD, etc., the gas cannot be supplied smoothly if a part of the secondary reflecting mirror is located directly in front of the target surface.

For this reason, by not irradiating light onto the target surface from the perpendicular direction, the present invention allows performing CVD, etc. smoothly.

Needless to say, under the present invention the target surface is not normally irradiated with the primary component of light from directly beside, or specifically from the direction of the plane that includes the target surface, because the target surface is not heated efficiently this way.

(Second Converging Mirror-Based Furnace)

FIGS. 1 (a) and 2 are drawings relating to a second converging mirror-based furnace proposed by the present invention, where FIG. 1 (a) is a section view showing an example of a converging mirror-based furnace using two sets or four sets of converging mirror units 7. Spheroids whose interior surfaces provide reflecting surfaces to reflect the infrared light emitted from an infrared lamp 2 are used as a primary reflecting mirror M1 and secondary reflecting mirror M2.

The concept of the reflecting mirror unit used for this second converging mirror-based furnace is shown in FIG. 1 (b). In FIG. 1 (b), a light source is positioned at one focal point F1 on the primary reflecting mirror M1 whose reflecting surface is a spheroid. The light emitted from this light source is reflected by the primary reflecting mirror M1 and forms an image at the other focal point F2. This focal point F2 is the same as one focal point F3 on the secondary reflecting mirror M2 whose reflecting surface is a spheroid, and the light coupled at this focal point F2/F3 diffuses again.

Thereafter, the light forms an image at the other focal point F4 on the secondary reflecting mirror, but this focal point F4 can be adjusted to be positioned on the surface of the target 3.

While the focal point F4 is positioned on the target here, in a different embodiment F4 may be positioned not on the target or positioned along the line normal to the target surface. As mentioned above, these first and secondary reflecting mirrors are both a reflecting mirror whose reflecting surface is constituted by the interior surface of a spheroid formed around the long axis of a ellipsoidal body as its rotational axis, and the infrared light irradiated toward the target from the infrared lamp 2 provided at the focal point F1 of the primary reflecting mirror is irradiated onto the target both directly and after being reflected by the reflecting surface.

Converging mirror type furnace 1 of the present invention shown in FIG. 1 (a) is a system where the two focal points of the primary reflecting mirror M1 and the two focal points of the secondary reflecting mirror M2 are placed on a single straight line and the figure shows the primary reflecting mirror and secondary reflecting mirror are connected in a linear fashion.

With the interior surface of the primary reflecting mirror M1, infrared light emitted from the infrared lamp 2 is first primarily reflected by the internal surface of the primary reflecting mirror M1. Infrared lamp 2 is installed inside the primary reflecting mirror M1 such that the filament of the infrared lamp 2 is positioned at one focal point F1 of the primary reflecting mirror M1. The infrared light reflected by the internal surface of the primary reflecting mirror M1 converges at the other focal point F2 of the spheroid.

This other focal point F2 where the infrared light converges represents the same position as one focal point F3 of the secondary reflecting mirror M2, and therefore, considering the secondary reflecting mirror M2 alone, it looks as if the filament of the infrared lamp were provided at one focal point F3. After converging at the one focal point F3, the infrared light diverges again and is reflected by the interior surface of the secondary reflecting mirror M2.

Then, the infrared light that has been reflected by the interior surface of the secondary reflecting mirror M2, which is a spheroid, converges again at the other focal point F4 of the secondary reflecting mirror M2.

At this point, if the target 3 is positioned at the other focal point F4 of the secondary reflecting mirror M2, said target is rapidly heated to high temperatures by the converged infrared light.

For this reason, it is necessary to open a hole in the primary reflecting mirror M1 to install infrared lamp 2 and, moreover, it is necessary to provide a connection part 4 between the primary reflecting mirror and secondary reflecting mirror to form an optical path from the primary reflecting mirror M1 to the secondary reflecting mirror M2.

Similarly, the secondary reflecting mirror M2 must be provided with a connection part 4 for connecting to the primary reflecting mirror M1 to provide an optical path needed to introduce infrared light from the primary reflecting mirror M1, and the secondary reflecting mirror M2 must also be provided with an opening 5 through which to irradiate infrared light toward the target 3 in such a way that the other focal point F4 of the secondary reflecting mirror M2 is positioned on the surface of the target 3 or along a straight line connecting the center of the target surface and one focal point F3 of the secondary reflecting mirror.

In the above constitution, the area of the interior surface of the primary reflecting mirror M1 and the secondary reflecting mirror M2 must be made as large as possible in order to use the infrared light emitted from the infrared lamps 2 as the energy to heat the target 3 as effectively as possible. Particularly when the target material to be irradiated is small, the smaller the aperture of the opening 5 in the secondary reflecting mirror is, the better. For this reason, it is desired to make the shape of the secondary reflecting mirror M2 as elongated as possible.

For this reason, when the infrared lamp 2 is installed on one focal point F1 of the primary reflecting mirror M1, as much as possible, the closer to 1 the ratio of the long axis to the short axis of the ellipse of the primary reflecting mirror M1 is, the more the infrared light emitted from the focal point is partially absorbed by the infrared lamp itself as the infrared lamp 2 itself acts as an obstruction as shown in FIG. 3, or the smaller the amount of main light beam which is not reflecting becomes. Consequently, more infrared light hits the interior surface of the primary reflecting mirror M1 and is reflected thereby, and it becomes possible to be guided toward the secondary reflecting mirror M2. However, the primary reflecting mirror M1 becomes closer to a sphere when the aforementioned ratio gets too close to 1, in which case an ellipse shape capable of supplying a sufficient amount of infrared light toward the secondary reflecting mirror M2 may not be retained.

FIG. 3 provides a schematic illustration of an example where the ratio of the major axis to the minor axis of the ellipse of the primary reflecting mirror M1 is small and closer to 1, and as for the infrared light emitted from the filament of the infrared lamp provided at one focal point F1, only those components of infrared light having a heading angle θ1 clearly smaller than 60° are emitted toward the infrared lamp 2 itself, and the remaining components of infrared light over a wide range exceeding 300° can be reflected by the interior surface of the primary reflecting mirror M1.

However, as shown in FIG. 4 that also provides a schematic illustration, the shape of the primary reflecting mirror M1 becomes long and thin with the focal point positioned close to the interior surface, when the ratio of the major axis to the minor axis of the ellipse of the primary reflecting mirror M1 is large. For this reason, installing the infrared lamp 2 at one focal point F1 results in noticeably more of the emitted infrared light than in the example shown in FIG. 3, or specially those components emitted over a wider angle θ2 fail to reach the reflecting surface, and in FIG. 4, only the infrared light in a range of approx. 250° reaches the reflecting surface.

As a result, it is clear that when it is necessary to lower the ratio of the major axis to the minor axis of the ellipse of the primary reflecting mirror M1 as much as possible for the effective utilization of the infrared light emitted from the infrared lamp 2 for the purpose of heating, or specifically for the efficient heating of the target. Then, because the calorific value absorbed by the infrared lamp itself is reduced, rise in the temperature of the converging mirror unit itself tends to be suppressed.

Also, reducing this ratio of the major axis to the minor axis, as a result, leads to a longer distance between the infrared lamp 2 and the interior surface of the primary reflecting mirror M1, which makes it possible to lower the temperature at which the primary reflecting mirror M1 is heated locally.

This ratio of the major axis to the minor axis of the primary reflecting mirror M1 is preferably 1.1 to 2.0, or more preferably 1.1 to 1.5.

Furthermore, the secondary reflecting mirror M2 is provided with an opening 5 through which to emit infrared light toward the target 3 as mentioned above.

For example, if a quartz pipe 6, etc., is provided from the top to bottom of the target 3 to treat the target 3 while supplying gas thereto, interference between the secondary reflecting mirror M2 and the quartz pipe 6, etc., must be avoided.

For this reason, the opening 5 is not provided in the secondary reflecting mirror M2 simply to emit infrared light, but it must be provided by considering the size, position, moving range, and other specifics of the quartz pipe 6, etc. Preferably the opening 5 provided in consideration of these items is made as small as possible. This way, components of infrared light that come out of the reflecting mirror M2 and diverge without irradiating the target 3 can be reduced, and consequently more infrared light can be irradiated onto the target 3 to contribute to the raising of its temperature. In addition, components of infrared light that do not irradiate the target 3 but heat the surroundings can also be reduced.

The foregoing does not only apply to the quartz pipe, but whenever the target is given a treatment other than one involving heating, an opening 5 can be provided to the extent that the applicable treatment means does not interfere with the secondary reflecting mirror M2.

With the converging mirror-based furnace 1 of the present invention, the secondary reflecting mirror M2 can be installed in such a way that the other focal point F4 of the secondary reflecting mirror M2 is positioned on the target or in such a way that F4 is not positioned on the target 3, as long as the center of the surface of the target 3 is positioned on the straight line connecting the two focal points of the secondary reflecting mirror M2.

In other words, if the filament of the infrared lamp 2 forms an image on the surface of the target 3 to make uniform heating difficult, it is possible to not position the other focal point F4 on the target 3, but to position the center of the target 3 on a straight line connecting the center of the target 3 and two focal points F3 and F4 of the secondary reflecting mirror M2 to purposely achieve a defocusing effect, while positioning the other focal point of the secondary reflecting mirror M2 not on the target 3, so as to achieve more uniform heating in the range where an image of the filament does not form.

FIG. 2 is a top view outlining another example of a converging mirror-based furnace conforming to the present invention, where three converging mirror units 7 are provided and certain means (not illustrated) are used to make these converging mirror units 7 and/or the target movable in vertical and horizontal directions as desired, which makes it possible to adjust the position relationship of the center of the target surface and the other focal point of the secondary reflecting mirror. Also in FIG. 2, space is made among the three converging mirror units 7 and, if necessary, a unit for cooling the converging mirror units 7 or unit for transporting, treating, or otherwise manipulating the target can be installed in this space.

FIG. 5 shows another embodiment of a converging mirror-based furnace conforming to the present invention. This converging mirror-based furnace shown in FIG. 5 has the same basic structure as that of the converging mirror-based furnace shown in FIGS. 1 (a) and 2, but it is different in terms of the type of connection between the primary reflecting mirror M3 and secondary reflecting mirror M4. To be specific, the focal points of the spheroids constituting the primary reflecting mirror M3 and secondary reflecting mirror M4 are not positioned along one straight line, but the primary reflecting mirror M3 is bent upward and connected to the secondary reflecting mirror M4, and consequently in this example, the two straight lines including the straight line connecting the focal points of the ellipse of the primary reflecting mirror M3 and the straight line connecting the focal points of the ellipse of the secondary reflecting mirror M4 are not on the same straight line.

This example is different from the system illustrated in FIGS. 1 (a) and 2 where the two straight lines are on the same straight line. This type of arrangement makes it possible to reduce the size of the converging mirror-based furnace 1 in the width direction, and when the primary reflecting mirror M3 and the infrared lamp 2 to be used are installed vertically, replacement of the infrared lamp 2 and other maintenance tasks required by the system can be performed from above, which makes these tasks easier to perform and/or improves the ease of installing a cooling unit.

Also, the height of the reflecting mirror unit as a whole can be lowered when the primary reflecting mirror M3 is not erected, but laid flat laterally, as shown in FIG. 5, and because installing the infrared lamp directly beside the primary reflecting mirror M3 also becomes possible, maintenance tasks can be performed more easily from the side, and the ease of installing a cooling unit also improves.

(Third Converging Mirror-Based Furnace)

As for a third converging mirror-based furnace proposed by the present invention, as shown in FIGS. 6 (a) and 7, as can be seen in the illustrations, it basically adopts the same configuration as that of the second converging mirror-based furnace shown in FIGS. 1 (a) and 5; with the third converging mirror-based furnace 1, however, the secondary reflecting mirrors M2 and M4 used by the second converging mirror-based furnace 1 are replaced with revolving paraboloidal mirror M5 or M6 instead of the revolving ellipsoidal mirrors.

The concept of the reflecting mirror unit used for this third converging mirror-based furnace is shown in FIG. 6 (b). In FIGS. 6 (b), the light source is positioned at one focal point F1 of the primary reflecting mirror M1 whose reflecting surface is a spheroid. The light emitted from this light source is reflected by the primary reflecting mirror M1 and forms an image at the other focal point F2. This focal point F2 is the same as the focal point F3 of the secondary reflecting mirror M2 whose reflecting surface is a revolving paraboloidal body, and the light coupled at this focal point F2 or F3 diffuses again.

The diffused light is then reflected by the secondary reflecting mirror and becomes parallel light, and this parallel light is irradiated onto the surface of the target 3.

Since the focal point F3 of the revolving paraboloidal mirrors M5 and M6 is the same as the other focal point of the primary reflecting mirrors M1 and M3, the infrared light emitted by the infrared lamp is introduced to the secondary reflecting mirror M5 or M6 which is a revolving paraboloidal mirror, as is the case with the second converging mirror-based furnace. This infrared light that has been introduced to the focal point of the revolving paraboloidal mirrors constituting the secondary reflecting mirrors M5 and M6 is emitted directly from the target-side opening 5 in the secondary reflecting mirror M5 or M6, or is reflected by the interior surface of the secondary reflecting mirror M5 or M6 and then emitted from the target-side opening 5.

As with the second converging mirror-based furnace 1, this third converging mirror-based furnace 1 also requires that the target-side opening 5 in the secondary reflecting mirrors M5 and M6 be provided not just to emit infrared light, but also by considering the quartz pipe and other members supplied with the system as well as the size, position or movement of the equipment, among other considerations. Preferably the target-side opening 5, provided in consideration of the aforementioned items, is positioned as far away as possible from the focal point from the viewpoint of reducing the quantity of diverging infrared light output from the secondary reflecting mirrors M5 and M6 so as to irradiate more infrared light onto the target to help raise its temperature.

As with the second converging mirror-based furnace 1, the third converging mirror-based furnace 1 proposed by the present invention is also such that space is made between the converging mirror units 7 and therefore, if necessary, a unit for cooling the converging mirror units 7 or unit for transporting, treating, or otherwise manipulating the target can be installed in this space.

(Fourth Converging Mirror-Based Furnace)

A fourth converging mirror-based furnace is explained using FIG. 8.

First, the curved surface that constitutes the ring-shaped reflecting surface 106 of such converging mirror-based furnace 101 is described.

The fourth converging mirror-based furnace proposed by the present invention is a converging mirror-based furnace where a ring-shaped reflecting surface is formed which in turn forms a primary reflecting mirror constituted by a closed space such as an ellipsoid, etc., and an infrared lamp is installed in the closed space. Also formed on the ring-shaped reflecting surface at a location where the straight line connecting the infrared lamp and target intersects with the ring-shaped reflecting surface is a slit that forms a secondary reflecting surface of a shape constituting a paraboloidal surface, etc., and the infrared light emitted from the infrared lamp 103 is directly irradiated onto the target or reflected by a mirror constituted by a ring-shaped reflecting surface or paraboloidal surface and then irradiated onto the target. The system, basically designed as mentioned above, may also be structured in such a way that the reflecting surface is formed as a ring surrounding the gas flow channel or quartz pipe or other pipe 107.

FIG. 8 is a concept section view of an example of the fourth converging mirror-based furnace whose reflecting surface is the interior surface provided to reflect the infrared light emitted from the infrared lamp 103. Although illustrated only partially in FIG. 8, the ring shape constituted by a combination of a reflecting surface 106 whose section is an ellipsoid or other closed reflecting surface 106 with a paraboloidal surface 111 whose section is a parabola (hereinafter referred to as "ring-shaped reflecting surface") is such that the reflecting surface 106 shown is a part of the ring-shaped reflecting surface and the infrared light emitted from the infrared lamp 103 toward the target is irradiated directly, or reflected by the ring-shaped reflecting surface and then irradiated, onto the target 102.

This slit 111 constituted by the ellipsoid or other reflecting surface 106 or paraboloidal surface, etc., is different from the aforementioned second or third converging mirror-based furnace in that it is not a revolving ellipsoid or revolving paraboloidal surface obtained by rotating around the line connecting the two focal points of the ellipse or symmetrical axis of the parabola, but it is an ellipsoid or other donut-shaped space or paraboloidal surface obtained by rotating around a rotational axis not intersecting with the ellipse or axis intersecting at an angle with the symmetrical axis of the parabola.

Also with this fourth converging mirror-based furnace, the entire surface of the target 102 must be heated uniformly and therefore the infrared light reflected by the ellipsoid or other reflecting surface 106 can be caused to diffuse to a certain extent, instead of simply forming a focus on the surface of the target 102. The light can also be caused to form a focus on the target so long as it can uniformly heat the entire surface of the target 102.

If the section of the reflecting surface 106 is an ellipsoid, the infrared light emitted toward the other focal point closer to the target forms a focus when the infrared lamp 103 is positioned at, of the focal points of the ellipse, the focal point farther away from the target. As a result, the heating temperature would vary on the surface of the target 102 should a focus be formed on the target by assuming that the surface of the target 102 provides the other focal point, and consequently proper treatment cannot be performed.

Accordingly, a ring-shaped reflecting surface can be constituted basically with a revolving ellipsoid obtained by rotating an ellipse around a rotational axis provided outside the ellipse, in order to irradiate infrared light without causing it to form a focus on the target surface, because there is no need for the light to form a focus on the surface of the target 102.

Needless to say, the ellipse is not the only option and any closed curved line or other closed line can be used.

Also, as shown in the section view of FIG. 8, the reflecting surface 106 of the converging mirror-based furnace 101 proposed by the present invention is a ring-shaped reflecting surface constituted by a combination of a revolving ellipsoidal mirror with a revolving paraboloidal mirror, and it draws a closed curved line surrounding the infrared lamp 103 in a section sliced by a plane that passes through the center of the two mirrors and lies perpendicular to the ring.

It should be noted that this infrared lamp 103 is caused to emit infrared light from a filament in the lamp, where the filament is not a point light source, but a surface light source or line light source to some extent. The ring-shaped reflecting surface constituted by a combination of a revolving ellipsoidal mirror with a revolving paraboloidal mirror is such that, as the ellipse is inclined toward the target, the parabola is also inclined to create an opening facing the target.

In FIG. 8, a slit 111 constituted by a revolving paraboloidal surface is provided to let the infrared light pass through, at a location near the point of intersection between the line connecting one focal point and the other focal point of the ellipse on which the infrared lamp 103 as well as the center of the target 102 on one hand, and the line that draws the ellipse on the other, and the ellipse is cut at the location of this slit 111 and the target is installed along a line extended from the slit 111 as viewed from the infrared lamp 103.

In FIG. 8, from the point of view of energy efficiency improvement, preferably the light emitted in each direction from the infrared lamp 103 is irradiated onto the target 102 with a small number of reflections on the ring-shaped reflecting surface 106. For this reason, the cross section of the ring-shaped reflecting surface 106 preferably has an ellipse shape as mentioned above, but it can also have any other similar shape.

In addition, it goes without saying that some infrared light may follow an optical path that is reflected by the wall of the slit 111 constituting the paraboloidal surface shown in FIG. 8 and then is irradiated onto the target 102.

With such system, a quartz pipe or other pipe 107 can be installed in such a way that it passes through the center of the ring of the ring-shaped reflecting surface at the center of the converging mirror-based furnace 101, as is the case with the second or third converging mirror-based furnace. By installing the pipe 107, gas 104 can be supplied toward the target through the pipe 107 from above or below during, before, or after heating.

Needless to say, the target can be positioned inside this pipe 107 or the end of the pipe 107 can be positioned above or below the target. The target can be processed using a jig (not illustrated) or a window can be provided on the side so that the condition of the target 102 can be monitored while the target 102 is being heated under any desired condition.

An example of a specific reflecting surface used by the converging mirror-based furnace 101 shown in FIG. 8 is illustrated in the schematic drawing of FIG. 9.

The reflecting surface shown in FIG. 9, as shown in (a) through (c), has a shape constituted by combining the ring-shaped reflecting surface 106 or another ellipsoidal mirror whose focal points are F5 and F6 and whose cross section is an ellipse, and a slit 111 of paraboloidal mirror, etc. which is a secondary reflecting mirror M8 whose cross section is the parabola in FIG. 8 and shares one focal point F6 of the ellipse.

If the ring-shaped reflecting surface M7 is an ellipse, for example, the part of the ring-shaped reflecting surface M7 indicated by the solid line is where a mirror is constituted to reflect infrared light, while the part indicated by the broken line is not actually a mirror, but it forms an opening instead, representing a part of the ellipse drawn to indicate that this reflecting surface is an ellipsoidal mirror in FIG. 9.

Similarly, of the slit 111 of M8 indicating the paraboloidal mirror shown in FIG. 8, the part indicated by the solid line is where a mirror is constituted to reflect infrared light, while the part indicated by the broken line is not actually a mirror, but it constitutes a parabola instead, representing a part of the parabola drawn to indicate that the slit 111 is a paraboloidal mirror in FIG. 9.

In FIG. 9, different paths are shown through which the infrared light emitted from the infrared lamp installed at F5 is emitted toward the target from the reflecting mirror. As shown in (a), the infrared light emitted from the infrared lamp is partially irradiated directly onto the target without being reflected by the interior surface of the slit 111 or after reflecting and then passing through the slit 111 as parallel light.

Also, as shown in (b) and (c), the majority of the infrared light emitted from the infrared lamp hits the ring-shaped reflecting surface M7 and reflects at least once by the rotating paraboloidal surface of M8 being the secondary reflecting mirror, and then passes through the slit 111 and is irradiated onto the target 102.

(b) shows an optical path where the infrared light emitted toward the opposite side of the slit 111 from the infrared lamp installed at F5 is reflected by the ring-shaped reflecting surface M7 being an ellipsoidal mirror, etc., and then directly travels or is reflected by the slit 111 and travels toward the target.

(c) shows an optical path where infrared light is emitted from the infrared lamp installed at F5 toward a direction lateral to the infrared lamp other than the direction in (a) or (b), wherein the infrared light is not reflected by the ring-shaped reflecting surface M7 being an ellipsoidal mirror, etc, and then directly irradiated onto the target, but it reflects at least once on the slit 111 and then is irradiated onto the target.

As mentioned above, the cross section of the ring-shaped reflecting surface M7 is a combination of the ring-shaped reflecting surface and the slit, and the infrared lamp 103 is installed at the focal point of this ring-shaped reflecting surface being an ellipsoidal, etc., or other position not exactly on the focal point but close to the focal point. Because the target is not positioned at the other focal point of the ellipse, etc., however, the light reflected by the ring-shaped reflecting surface M7 does not form a focus on the surface-to-be-heated of the target 102, but it hits the surface of the target 102 uniformly, and consequently the shape of the coil of the infrared lamp is not casted on the target 102.

As shown in (a) through (c) as above, much of the infrared light emitted from the infrared lamp can be irradiated onto the target and therefore much of the energy emitted from the infrared lamp can be used for heating, which clearly improves the heating efficiency.

Needless to say, while the ring-shaped reflecting surface shown in FIGS. 8 and 9 is an ellipse, it can also have a non-ellipse shape which is based on this ellipse shape but whose surface is partially constituted by a straight line, etc.

Furthermore, the subject shown in FIG. 9 also applies correspondingly to the optical paths of light with the first through third converging mirror-based furnaces.

FIG. 10 is a drawing illustrating a combination of members that constitute a ring-shaped reflecting surface, as viewed from the bottom, where the right side specifically provides a section view cut at the infrared lamp 103.

In FIG. 10, the ring-shaped reflecting surface may not be a completely closed ring, but two ring-shaped reflecting surfaces 106 may be provided that each are of roughly one half the size and capable of accommodating one of the two infrared lamps 103 each connected to a power cable, and the infrared lamps 103 are respectively fixed by members (not illustrated). As described above, the ring shape does not necessarily mean a complete ring of 360°, but the ring may be cut near the bent part of the infrared lamp in some cases to allow for assembly of or to accommodate the infrared lamp structure of the system, but it is necessary to not cut the ring at too many locations around its 360° perimeter to prevent uneven heating of the surface-to-be-heated.

Where the infrared lamp 103 is fixed, the area constituted by the ring-shaped reflecting surface 106 can also be provided with an inlet and outlet to supply and discharge cooling air to prevent overheating of the high-temperature heating path itself during heating.

Although not shown in FIG. 10, a slit that extends along the circumferential direction of the ring-shaped reflecting surface is formed on the bottom surface.

The ring-shaped reflecting surface 106 under the present invention is such that the diameter of the ring constituted by the reflecting surface is 120 to 160 mm, while the section of the ring-shaped reflecting surface cut by a plane passing through the center of the ring and perpendicular to the ring is 45 to 55 mm in the long-axis direction and 35 mm to 45 mm in the short-axis direction. If both dimensions are too small, the infrared lamp cannot be inserted with a sufficient distance kept from the reflecting surface, but if these dimensions are too large, reducing the size of the converging mirror-based furnace itself may become difficult. Basically, a reflecting surface of the aforementioned size is sufficient, even when heating to 2000° C. or above is required within several seconds, although the specific size varies depending on the output of the infrared lamp.

The member constituting the ring-shaped reflecting surface 106 may be made of aluminum alloy, etc., where the constituent metal member is stable, does not expand much under heat, and has excellent heat resistance. Accordingly, preferably the member constituting the ring-shaped reflecting surface 106 is also a ring-shaped metal member and plated with gold offering high reflecting efficiency with respect to infrared light. For this reason, a quartz pipe, etc., may be inserted at the center of the ring to generate single crystal inside the quartz pipe, for example. It is also possible to apply CVD or other treatment.

So that such treatment is possible, the ring-shaped metal member itself has an outer diameter of 190 to 230 mm or preferably 200 to 220 mm and a thickness of 60 to 80 mm or preferably 65 to 75 mm, and the hole at its center has a diameter of 30 to 40 mm. The range of outer diameters reflects the size of the ring-shaped reflecting surface 106 to be formed inside, plus the thickness of the metal member, etc., while the range of thicknesses also represents the thickness of the ring-shaped reflecting surface 106 plus the thickness of the metal member, etc. The outer diameter of the hole at the center of the ring-shaped metal member must be large enough for a quartz pipe or other member to run through it.

The aforementioned slit provided in the ring-shaped reflecting surface 106 is formed by a parabola line in such a way that the target can be heated uniformly, or specifically to allow the line connecting the infrared lamp 103 and target to pass through it. And, as with the surface of the ring-shaped reflecting surface 106, the interior surface of the slit is also plated or otherwise coated with gold or other material offering high reflectance with respect to infrared light so as to reflect infrared light.

Additionally, this slit must be extended as close as possible to the target in order to irradiate more infrared light onto the target. For this reason, the bottom part of the ring-shaped metal member where the slit is made is formed to be extendable.

To achieve efficient heating and a smaller system, the shortest straight distance between the infrared lamp 103 and the center of the target is 70 to 95 mm, or preferably 75 to 90 mm, while the shortest straight distance from the top of the slit is 30 mm to 40 mm.

If these distances become longer, efficient heating and size reduction become difficult; whereas, shorter distances may lead to difficulty operating the system or implementing uniform heating.

When the size of each member, etc., is considered, as described above, preferably the converging mirror-based furnace proposed by the present invention is constituted in such a way that the surface of the horizontally set target is heated by the infrared light irradiated at an angle of 20 to 70°. If this angle is less than 20°, the infrared light emitted from the ring-shaped reflecting surface cannot be irradiated onto the target efficiently and there is a possibility that the infrared light may miss the target and irradiate other members. If the angle is 70° or greater, on the other hand, it becomes difficult to secure space in which to install a jig or gas supply device vertically above the target.

In FIG. 10, one infrared lamp 103 with a power cable 112 is installed on each half of the ring-shaped reflecting surface, and both ends of the infrared lamp 103 are fixed to the furnace. According to this constitution, the target can be irradiated with infrared light virtually from all directions when two infrared lamps 103 are installed. The number of infrared lamps 103 need not be two, but one, three or more infrared lamps 103 may be installed to the extent possible to cover as much circumference as possible.

The ring-shaped reflecting surface 106 and ring-shaped metal member are heated by absorbing the infrared light from the infrared lamp during operation, so it is essential that a cooling unit be installed in the converging mirror-based furnace. The ring-shaped reflecting surface 106 and other units are explained by referring to FIG. 8 again.

In FIG. 8, a groove is provided beforehand for a cooling jacket 113 to pass cooling water on the exterior surface of the ring-shaped metal member to cool the ring-shaped metal member constituting the ring-shaped reflecting surface 106, and subsequently a cooling jacket 113 is formed between the groove and a lid member 114 to be installed, and a cooling-water supply pipe 115 is connected to the jacket via a cooling-water supply port 116. While cooling water is passed only on the top surface of the ring-shaped metal member here, a structure may be provided to pass cooing water in other areas such as along the circumference of the ring-shaped metal member.

FIG. 11 shows a top view of the converging mirror-based furnace 101 conforming to the present invention. The cooling-water supply pipe 115 and cooling-water drain pipe 117 are connected to the circular top face of the converging mirror-based furnace 101 via the cooling-water supply port 116 and cooling-water drain port 118, respectively. Among the broken lines drawn in FIG. 11, the line enclosing the largest area indicates the position of the ring-shaped reflecting surface 106, although it is not visible from the top face, while the area enclosed by the inner broken line indicates the cooling jacket 113.

Water supplied from the cooling-water supply pipe 115 to the cooling jacket 113 via the cooling-water supply port 116 flows through the cooling jacket 113 and cools the ring-shaped metal member from inside the cooling jacket 113, and then is drained from the cooling-water drain pipe 117 via the cooling-water drain port 118.

Drained water is supplied to the radiator (not illustrated) and air-cooled there by air for cooling. Following the circulation path, this cooled water is again supplied to the cooling jacket via the cooling-water supply pipe connected to the furnace.

Needless to say, fresh cooling water may be supplied from the outside instead of supplying recirculated water to the radiator, but this requires connecting a pipe to supply cooling water from outside of the system and this may limit the installation location of the furnace; accordingly, it is preferable to circulate cooling water with a pump via a radiator or other cooling unit.

With the second and third converging mirror-based furnaces conforming to the present invention, the infrared lamp 103 is preferably a halogen lamp, although any known infrared lamp can be used, and the infrared lamp 103 may be of the type that emits infrared light using filaments.

Furthermore, if necessary an opening may be provided, on the member securing the infrared lamp 103 onto the ring-shaped reflecting surface 106, for example, in order to introduce or discharge air for cooling the interior of the ring-shaped reflecting surface 106. In this case, cooling air passes through the space between the infrared lamp 103 and ring-shaped reflecting surface and cools both, which means that the supplied cooling air is used for cooling in an efficient manner.

Although not illustrated, the second and third converging mirror-based furnaces proposed by the present invention have a structure where the furnace is supported by supporting members inside a frame cover, as is the case with known furnaces, and the frame cover that accommodates the converging mirror-based furnace comprises a top panel, front door, side panels, rear panel, and bottom panel, and the front door is opened and closed to insert and remove a target, etc. The top panel can have an opening through which to insert a quartz pipe or other long member to be used to generate single crystal, while the top panel, side panels, rear panel, and bottom panel can have an opening through which to pass the power cable for the infrared lamp, pipe for supplying and discharging cooling water, pipe for supplying and discharging the processing gas to be circulated inside the converging mirror-based furnace, and, if both the infrared lamp and reflecting surface are to be cooled with cooling air, pipe for supplying and discharging this cooling air.

The frame cover can also be provided with a sight glass so that the target can be observed from outside the system.

The frame cover accommodating the converging mirror-based furnace proposed by the present invention may be installed on a base. The base can have various units for operating the furnace installed in it, such as a power supply, controller, and radiator for the furnace, unit for circulating cooling water, unit for supplying cooling air, and unit for moving the target.

When the system is used to grow single crystal, a quartz pipe 207 is inserted into the ring-shaped reflecting surface pipe 206 in a manner penetrating through the center of the ring, and a polycrystal material bar 209 and seed crystal bar 210 are fixed to top and bottom fixing means 208 which is driven inside the pipe, as shown in the schematic drawing of FIG. 12. Then, the infrared light emitted from the infrared lamp 203 reflects on the ring-shaped reflecting surface 206 and heats the polycrystal material bar 209 and seed crystal bar 210, and while being heated this way, these material bar 209 and seed crystal bar 210 move downward to generate single crystal.

As described above, the present invention is structurally different from a conventional system that heats the target from the side by reflecting infrared light on a revolving ellipsoid, and accordingly the target being heated can be monitored from its side and the operating status of the CVD furnace or single crystal growth system, whichever the case may be, can be monitored during heating.

Furthermore, since the target is heated with the infrared light irradiated from diagonally above, the infrared lamp 203 and ring-shaped reflecting surface 206 can be positioned above the target, which in turn allows for using a ring-shaped reflecting surface 206 smaller than what is required when the conventional revolving ellipsoid is used, thereby reducing the space between the infrared lamp 203 and ring-shaped reflecting surface 206 on one hand and the target on the other.

A treatment method using such converging mirror-based furnace is described. For example, in FIG. 12, a quartz pipe 207 is inserted into the hole at the center of the ring-shaped metal member on which the ring-shaped reflecting surface 206 is provided, and, for example, the target is securely inserted into the bottom end of the opening of the quartz pipe 207 and fixed at a position to which the infrared light from the infrared lamp 203 is emitted. If necessary, the space inside the quartz pipe 207 is replaced with treatment gas or treatment gas is supplied through the pipe, or cooling water is supplied and circulated through a cooling jacket, and air to cool the infrared lamp 203 is introduced and circulated from the part where the infrared lamp 203 is fixed.

In this condition, the power to the infrared lamp 203 is turned on to start heating and the temperature is controlled, and the moment the specified treatment is given, the heating temperature is lowered. After the treatment, the target is removed from the bottom end of the quartz pipe 207 and transferred to the next treatment process.

To perform heat treatment continuously, the next target is inserted from the bottom end of the quartz pipe 207, fixed, and then heated, instead of stopping the supply of cooling water or air. Needless to say, use of the quartz pipe 207 is not a requirement and whether or not to use the pipe can be determined as desired according to the necessity.

The target to be heated by the converging mirror-based furnace proposed by the present invention may be glass, semiconductor material, metal, ceramic, resin, or any other object normally processed by means of heating. The furnace can also be used for some manufacturing processes for LSIs, MEMS, etc.

To be specific, it can be used as a deposition system, CVD furnace, single-crystal manufacturing system, or other system that involves heating.

In these applications, the size of the target is determined by the specific application to some extent; on the other hand, the present invention allows for treatment of targets of any size, but preferably those of 50 mm or less in diameter, or more preferably those of 30 mm or less in diameter, or most preferably those of 15 mm or less in diameter, as these dimensions make suitable targets.

In addition, the target can have any shape so long as the surface irradiated by light is flat, and a non-flat surface is also acceptable to the extent that the object of the present invention is met.

Also according to the converging mirror-based furnace proposed by the present invention, the target surface can be heated to 2000° C. or above in several seconds after the start of heating, meaning that the speed of heat-treating the target can be improved.

The invention claimed is:

1. A converging mirror-based furnace for heating a target by causing light emitted from a light source to be reflected by a reflecting mirror unit to irradiate the target,
wherein at least one reflecting mirror unit with a light source installed inside is provided;
the reflecting mirror unit is formed by combining two spheroidal mirrors each having a reflecting surface constituted by the interior surface of a spheroid having a full-circle cross section, where one of the spheroidal mirrors is referred to as a primary reflecting mirror and the other, a secondary reflecting mirror;
a light source is installed in the primary reflecting mirror wherein the light source is positioned at one focal point of the primary reflecting mirror, while an opening provided in the primary reflecting mirror is inter-connected with an opening provided in the secondary reflecting mirror wherein another focal point of the primary reflecting mirror is positioned at one focal point of the secondary reflecting mirror, and the reflecting mirror unit is provided wherein another focal point of the secondary reflecting mirror is positioned on the normal line which passes through a center point of the surface-to-be-heated of the target placed in the furnace, with the opening provided at a side of the other focal point in the secondary reflecting mirror so that the light passes through the opening toward the surface-to-be-heated to irradiate the surface-to-be-heated, said light source being entirely surrounded by the primary reflecting mirror except for the opening of the primary reflecting mirror as viewed from the opening; and the long axis of an ellipsoid body constituting the secondary reflecting mirror is positioned diagonally to the normal line of the surface-to-be-heated,
wherein the ratio of the major axis to the minor axis of the ellipse configuring the primary reflecting mirror is equal to or less than the ratio of the major axis to the minor axis of the ellipse configuring the secondary reflecting mirror.

2. A converging mirror-based furnace according to claim 1, wherein the primary reflecting mirror and secondary reflecting mirror are connected wherein the light source is positioned along a straight line connecting the two focal points on the ellipse of the secondary reflecting mirror.

3. A converging mirror-based furnace according to claim 1, wherein the primary reflecting mirror and secondary reflecting mirror are connected wherein the two focal points on the ellipse of the primary reflecting mirror and two focal points on the ellipse of the secondary reflecting mirror are not present on the same straight line.

4. A converging mirror-based furnace according to claim 1, wherein the angle formed by the surface of the target and the line connecting the two focal points on the ellipse of the secondary reflecting mirror is 20 to 70°.

5. A converging mirror-based furnace for heating a target by causing light emitted from a light source to be reflected by a reflecting mirror unit to irradiate the target,
wherein at least one reflecting mirror unit with a light source installed inside is provided;
the reflecting mirror unit is formed by combining a primary reflecting mirror being spheroidal mirror whose reflecting surface is constituted by the interior surface of a spheroid having a full-circle cross section, with a secondary reflecting mirror being an entirely revolving paraboloidal mirror whose reflecting surface is constituted by the interior surface of a revolving paraboloidal mirror;
the light source is installed in the primary reflecting mirror wherein the light source is positioned at one of two focal points on the primary reflecting mirror, while an opening provided in the primary reflecting mirror is inter-connected with an opening provided in the secondary reflecting mirror wherein the other focal point of the primary reflecting mirror is positioned at a focal point of the secondary reflecting mirror, and a converging mirror unit is provided wherein a rotational axis of the revolving paraboloidal mirror constituting the secondary reflecting mirror and a center point of a surface-to-be-heated of the target placed in the furnace are positioned along one straight line, with the opening in the secondary reflecting mirror facing the target so that the light is irradiated onto the surface-to-be-heated, said light source being entirely surrounded by the primary reflecting mirror except for the opening of the primary reflecting mirror as viewed from the opening; and
the rotational axis of the secondary reflecting mirror is not perpendicular to the surface of the target.

6. A converging mirror-based furnace according to claim 5, where the shortest distance between a focal point of the primary reflecting mirror and an elliptic surface thereof is greater than the shortest distance between a focal point of the secondary reflecting mirror and a parabolic surface thereof.

7. A converging mirror-based furnace according to claim 5, wherein the primary reflecting mirror and secondary reflecting mirror are connected wherein the two focal points on the primary reflecting mirror are positioned along a line extended from the rotational axis of the secondary reflecting mirror being a revolving paraboloidal mirror.

8. A converging mirror-based furnace according to claim 5, wherein the primary reflecting mirror and secondary reflecting mirror are connected wherein the two focal points on the primary reflecting mirror are not positioned along a line extended from the rotational axis of the secondary reflecting mirror being a revolving paraboloidal mirror.

9. A converging mirror-based furnace according to claim 5, wherein the angle formed by the line normal to the surface-to-be-heated and the rotational axis of the secondary reflecting mirror is 20 to 70°.

10. A converging mirror-based furnace for heating a target by causing light emitted from a light source to be reflected by a reflecting mirror unit to irradiate the target,
wherein the reflecting mirror unit has a primary reflecting mirror whose reflecting surface is a part of the interior surface of a ring drawn by rotating around the normal line a closed curved line which is present on the same plane as the normal line passing through the center of the surface-to-be-heated and not intersecting with the normal line;
a light source is installed in the ring that forms the primary reflecting mirror having a ring-shaped, in a manner being arranged over the ring either partially or entirely along the circumferential direction;
the target is set on a plane perpendicular to the normal line but not intersecting with the ring, with a slit provided in the reflecting surface near the point of intersection between the shortest straight line connecting the center of the surface-to-be-heated and light source on one hand and the reflecting surface on the other, in order to irradiate the light onto the target; and
the end of the primary reflecting surface where the slit is formed is connected to the reflecting surface that forms the secondary reflecting surface.

11. A converging mirror-based furnace according to claim 10, wherein the angle formed by the normal line and the line connecting the light source and the center of the target surface is 20 to 70°.

12. A converging mirror-based furnace according to claim 10, wherein a ring-shaped light source is installed in a circular pattern in the ring that forms the ring-shaped primary reflecting mirror, and a reflecting surface of the reflecting plate that converges the light from the ring-shaped light source onto the surface-to-be-heated is installed perpendicularly to the circle formed by the ring-shaped light source.

13. A converging mirror-based furnace according to claim 10, wherein, during heating, the relative position of the reflecting mirror and the target is made variable.

14. A converging mirror-based furnace according to claim 10, wherein, during heating, the condition of the target at least in terms of the temperature of the target or thickness of the formed film can be monitored at least from one direction such as directly above, diagonally above, or a side of the target.

15. A converging mirror-based furnace according to claim 10, wherein, during heating, the target is made rotatable.

16. A converging mirror-based furnace according to claim 1, wherein the primary reflecting mirror and secondary reflecting mirror are connected wherein the light source is positioned along a straight line connecting the two focal points on the ellipse of the secondary reflecting mirror.

17. A converging mirror-based furnace according to claim 1, wherein the primary reflecting mirror and secondary reflecting mirror are connected wherein the two focal points on the ellipse of the primary reflecting mirror and two focal points on the ellipse of the secondary reflecting mirror are not present on the same straight line.

18. A converging mirror-based furnace according to claim 1, wherein the angle formed by the surface of the target and the line connecting the two focal points on the ellipse of the secondary reflecting mirror is 20 to 70°.

19. A converging mirror-based furnace according to claim 6, wherein the primary reflecting mirror and secondary reflecting mirror are connected wherein the two focal points on the primary reflecting mirror are positioned along a line extended from the rotational axis of the secondary reflecting mirror being a revolving paraboloidal mirror.

20. A converging mirror-based furnace according to claim 6, wherein the primary reflecting mirror and secondary reflecting mirror are connected wherein the two focal points on the primary reflecting mirror are not positioned along a line extended from the rotational axis of the secondary reflecting mirror being a revolving paraboloidal mirror.

21. A converging mirror-based furnace according to claim 6, wherein the angle formed by the line normal to the surface-to-be-heated and the rotational axis of the secondary reflecting mirror is 20 to 70°.

22. A converging mirror-based furnace according to claim 11, wherein a ring-shaped light source is installed in a circular pattern in the ring that forms the ring-shaped primary reflecting mirror, and a reflecting surface of the reflecting plate that converges the light from the ring-shaped light source onto the surface-to-be-heated is installed perpendicularly to the circle formed by the ring-shaped light source.

23. A converging mirror-based furnace according to claim 11, wherein, during heating, the relative position of the reflecting mirror and the target is made variable.

24. A converging mirror-based furnace according to claim 11, wherein, during heating, the condition of the target at least in terms of the temperature of the target or thickness of the formed film can be monitored at least from one direction such as directly above, diagonally above, or a side of the target.

25. A converging mirror-based furnace according to claim 11, wherein, during heating, the target is made rotatable.

* * * * *